United States Patent [19]

Moose

[11] 4,084,088

[45] Apr. 11, 1978

[54] AUTOMATIC LIGHT SWITCH

[76] Inventor: Robert R. Moose, P.O. Box 376, Caddo, Okla. 74729

[21] Appl. No.: 685,644

[22] Filed: May 12, 1976

[51] Int. Cl.$^2$ ............................................. H01J 39/12
[52] U.S. Cl. .................................. 250/209; 250/214 B
[58] Field of Search .................. 250/208, 209, 214 R, 250/214 AL, 214 B; 317/124; 315/149, 155, 156, 158

[56] References Cited

U.S. PATENT DOCUMENTS

| | | | |
|---|---|---|---|
| 1,939,436 | 12/1933 | Conn | 250/214 AL |
| 3,901,813 | 8/1975 | Potopinski | 315/156 |
| 3,916,183 | 10/1975 | Duve et al. | 250/214 AL |

Primary Examiner—David C. Nelms
Attorney, Agent, or Firm—Head, Johnson & Chafin

[57] ABSTRACT

A light activated load switch for applying electrical power to load when its triggering light sensor is struck by a light source and including photosensing means to protect against triggering by inadvertent, ambient of unwanted light sources. The device includes adjustable timing means for automatic turnoff loads and for double triggering modes of operation.

22 Claims, 7 Drawing Figures

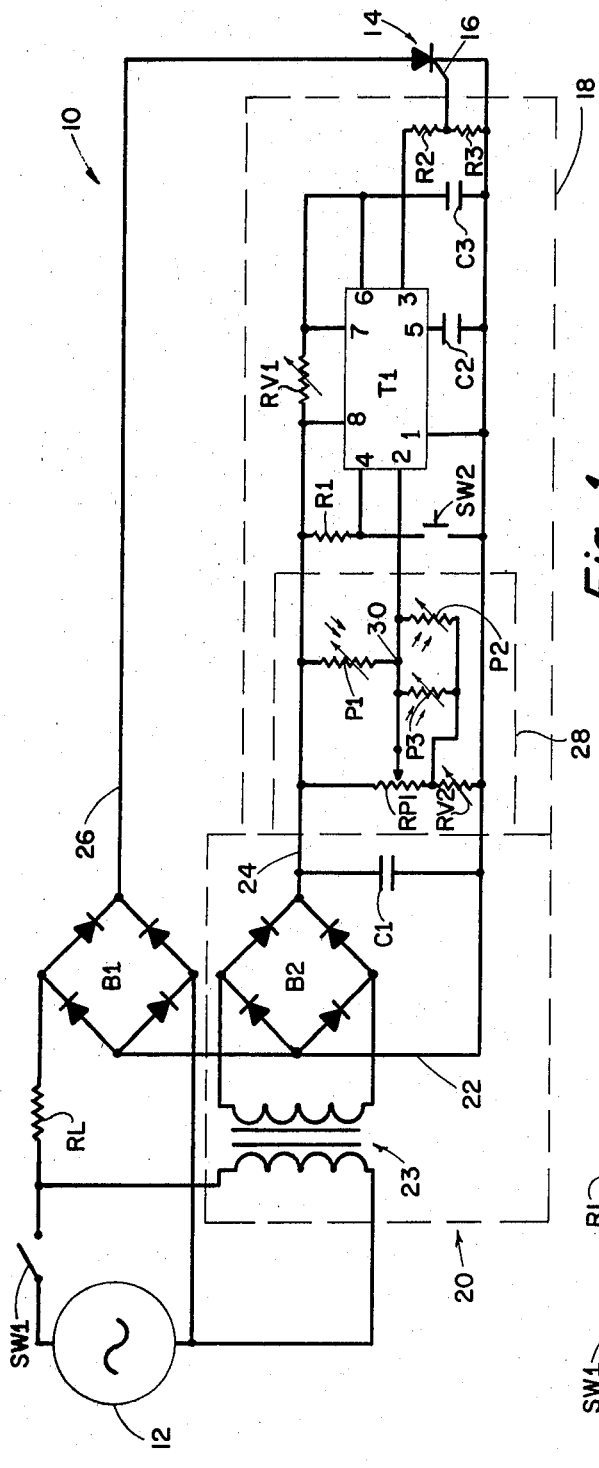
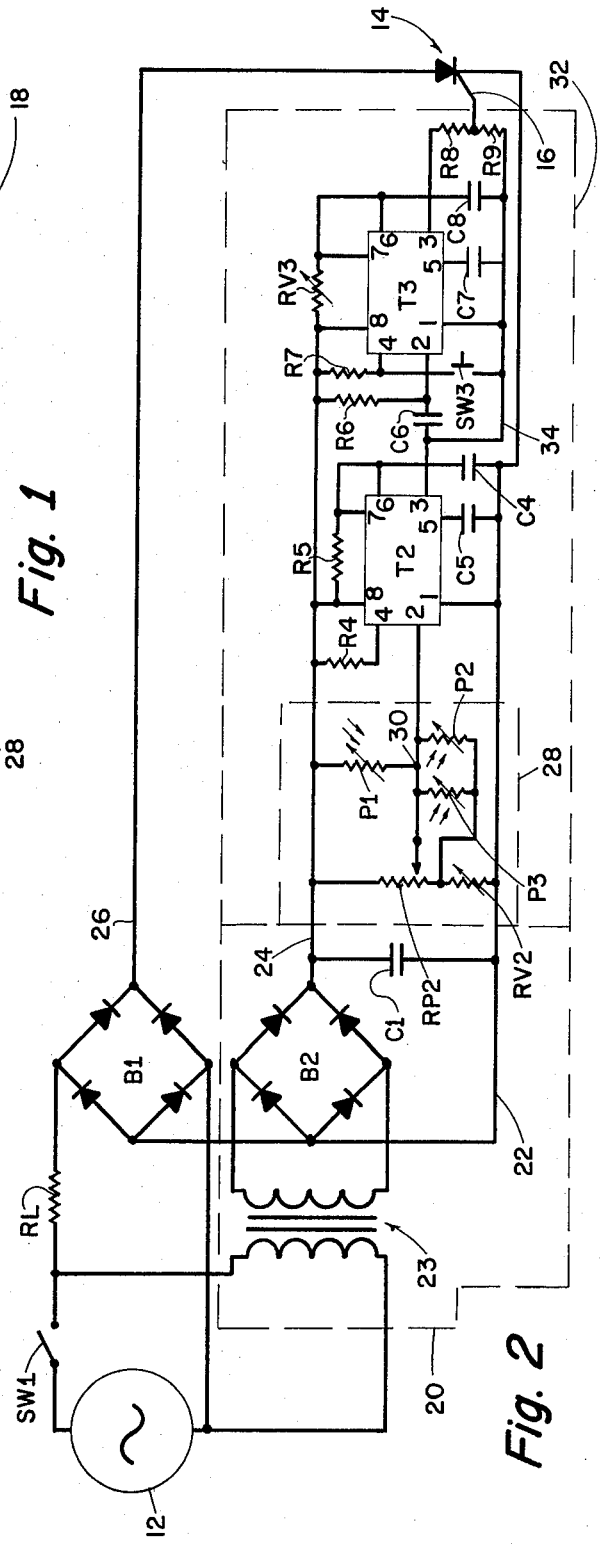
Fig. 1
Fig. 2

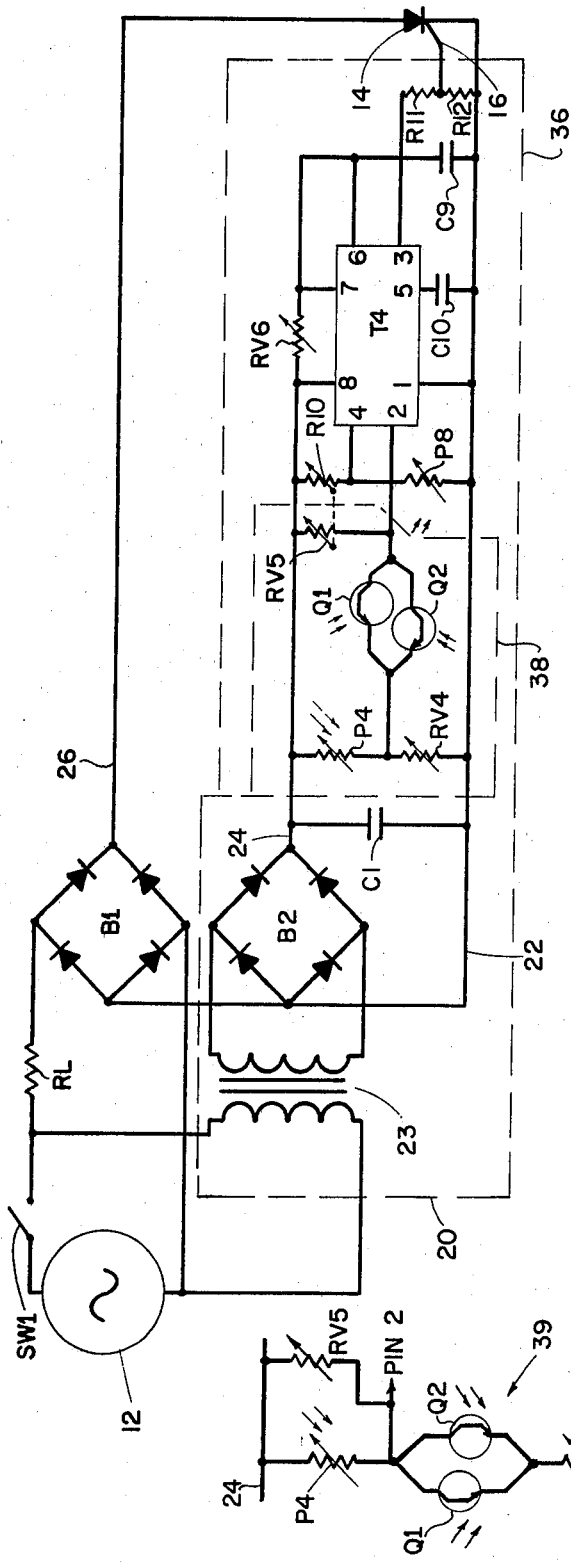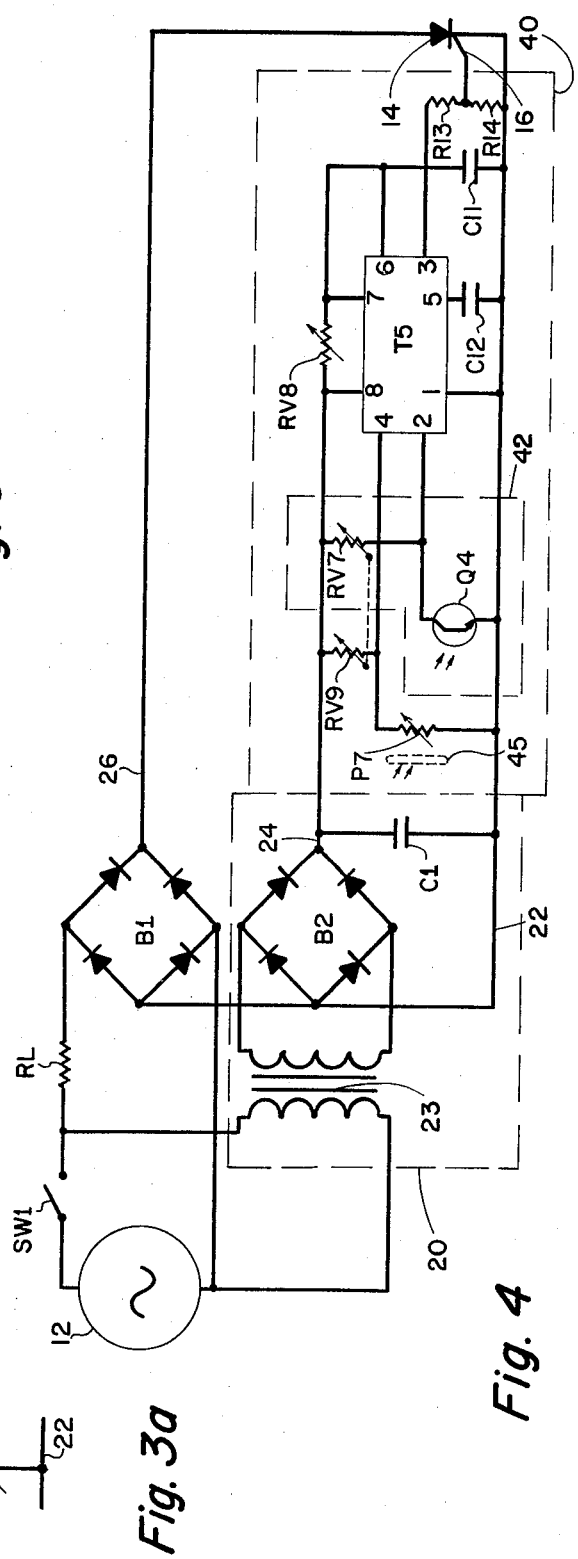
Fig. 3
Fig. 3a
Fig. 4

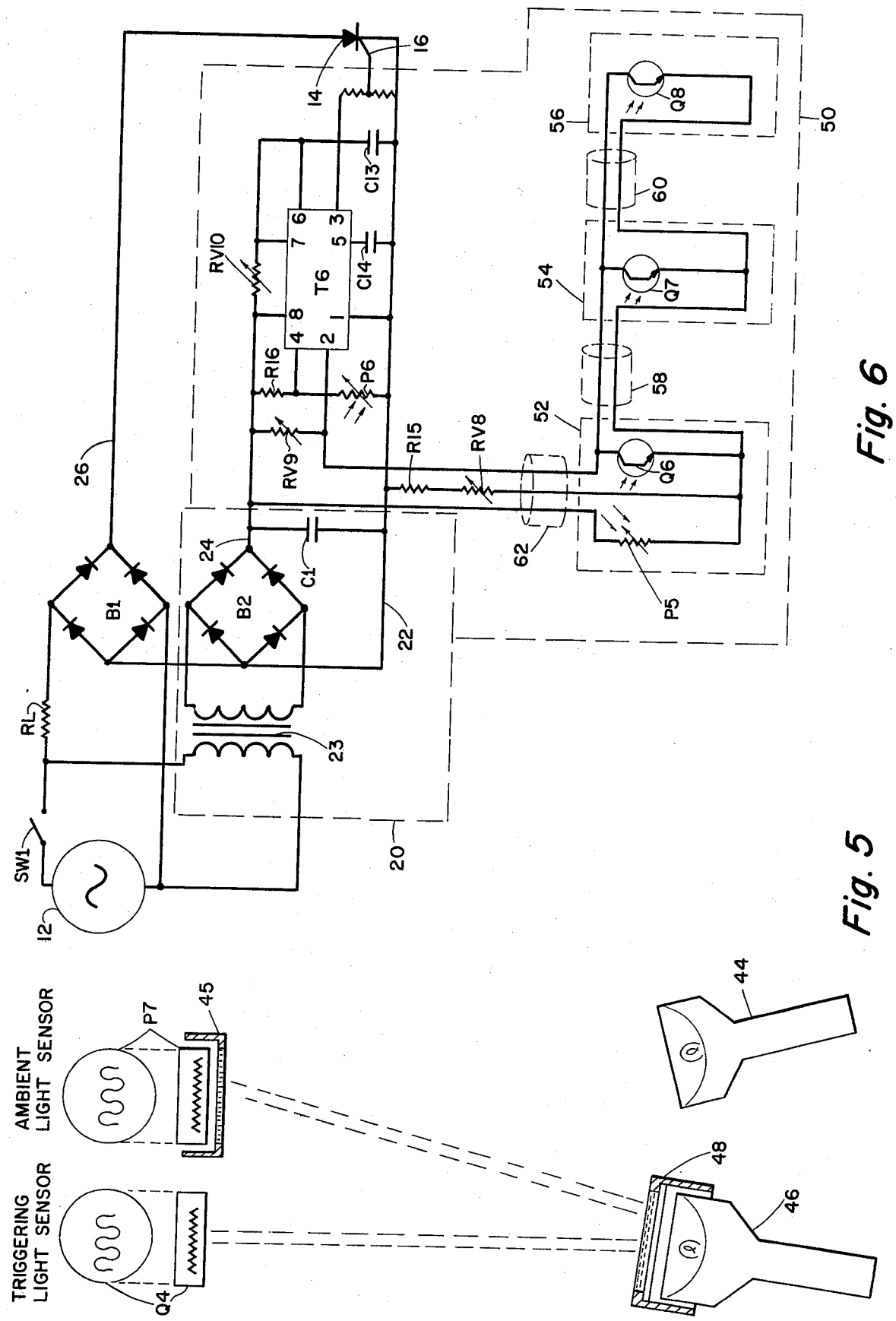

AUTOMATIC LIGHT SWITCH

BACKGROUND OF THE INVENTION

1. Field of the Invention

The present invention relates to a light activated switching means and more particularly, but not by way of limitation, to light activated switching means having selective timing means in conjunction with photosensitive blocking circuits to protect against triggering by unwanted ambient or stray light sources.

2. Description of the Prior Art

The marked increase recently in the crime rate, relating primarily to burglaries and muggings has given rise to the need for protecting homeowners and individuals when they arrive at home late at night. It has been asserted that one of the primary settings for crimes of this nature is darkness and there has been a distinct need for apparatus to provide lighting when an individual approaches a darkened house at night. Naturally, there is an added advantage, that being the prevention of accidents.

This increased crime rate has also affected stores which normally have minimal lighting at night after closing and are often subject to inspection by various security patrols during the course of the night. Heretofore, it has been the practice of storeowners to have minimal lighting on during the night and the security officer is required to peer in the window to determine whether or not there is or have been intruders. Applicant herein has recognized that it would be extremely beneficial if the security patrols would have a means, without having to enter the establishment, for turning on bright lights within the establishment in order to inspect the premises from the outside.

On the other hand, when there has been intrusion, it would also be helpful to be able to turn on the inside lights before the patrolman or police enters the establishment in order to inspect same. Heretofore, the patrolman has had to enter with nothing more than a flashlight or the like and to hunt around for a light switch whereby he can illuminate the premises while he completes the inspection. This is not only dangerous from an accidental standpoint but is extremely dangerous if the intruder is still present in the establishment.

The above problem relating to the increased crime rate and the need for being able to illuminate the premises of either the home or business tie hand in hand with the present energy crisis which makes it prohibitive from a power loss standpoint and an ecology standpoint to keep bright lighting around the home or around a business establishment while that establishment is closed.

The energy crisis also dictates the decreased use of lighting for advertising signs and for expressways and the like when they are not being used. Presently, if street lights or advertising signs are to be lighted, they are equipped with ambient light sensing sources which automatically turn on the street lamps or the advertising signs when darkness occurs. Applicant has noted in the case of advertising signs and even street lighting, that a vast amount of energy is wasted since these lights are on all of the time and many times in areas where the streets or highways are lightly travelled during the night hours.

Devices presently available on the market for controlling the lighting or electrical loads are normally operated by the lack of light or by darkness, which has the apparent disadvantage of wasting vast amounts of valuable energy since these devices stay on throughout the entire period of darkness.

SUMMARY OF THE INVENTION

The present invention is particularly designed and constructed to provide an efficient, effective light activated switching means for applying electrical power to a load, whether that load be a light fixture, street lighting, power machines, door operators or the like.

The apparatus basically comprises a silicone control rectifier switch which is gated by light activated triggering control circuits. The trigger control circuit obtains its power by way of low voltage power supply which is either connected to the main power source or even by way of a separate battery source.

The trigger control circuit basically comprises one or more parallel photosensing elements for activating a timing means, the output of the timing means providing the gating voltage for the silicon control rectifier switch means. Each of the embodiments of the invention also comprises, as a part of the trigger control circuit, an ambient light or stray light protection means for preventing inadvertent triggering of the timing means and in turn the SCR load switch.

In one of the embodiments, after the device is initially triggered, the circuit is configured to be immune from other triggering impulses throughout the timing interval. This embodiment is particularly suited for loads such as porch lights, garage lights, and the like triggered by auto headlights upon approach.

The second embodiment utilizes a dual timing means such that each triggering impulse restarts the timing interval which would be suitable for illuminating highway signs, advertisements and displays and even street lighting whereby it is desirable for each passing motorist to be able to trigger the light source on.

The third embodiment includes means so that the load may be turned off by a second triggering light impulse prior to completion of the timing interval which would be adaptable for use in a security system in a store or warehouse or the like.

All of the embodiments are configured to permit adjustment of sensitivity of the light sensors for its particular application and environment. The circuits also include remote positioning means of the triggering sensors which is helpful in protecting the control circuit from the elements and from tampering.

DESCRIPTION OF THE DRAWINGS

Other and further advantageous features of the present invention will hereinafter more fully appear in connection with a detailed description of the drawings in which;

FIG. 1 is a schematic diagram of a light triggered load switch representing one embodiment of the invention.

FIG. 2 is a schematic diagram of a light triggered load switch having dual timing means for restarting.

FIG. 3 is a schematic diagram of a light triggered load switch similar to that of FIG. 1 but utilizing phototransistors for the triggering sensors.

FIG. 3a is a schematic diagram of an alternate triggering circuit to that of FIG. 3.

FIG. 4 is a schematic diagram of a light triggered load switch and including photosensitive means for resetting the timer turning off the load.

FIG. 5 is a schematic functional diagram depicting the use of polarized filters by the light sensing means.

FIG. 6 is a diagram similar to that of FIG. 3 and showing remote location of triggering devices.

DETAILED DESCRIPTION OF THE PREFERRED EMBODIMENT

Referring to the drawings in detail, and particularly to FIG. 1, reference character 10 generally indicates a light operated switching means for applying electrical power from a power source 12 to a load RL. It is noted at this point that the load RL may constitute any conventional apparatus such as a motor, light bulb or the like. A switch SW1 is shown in series with the load RL and the power source 12 and may be conventional manual operated switch or may be in the form of a push-pull circuit breaker or current limiting device. The light activated switch itself is depicted as a silicon controlled rectifier (SCR) generally indicated by reference character 14 which is connected in series with the load RL and is provided with a gating input 16 which is operably connected to a light activated control circuit generally indicated by reference character 18. The switch means 14 could naturally be in the form of a triac triggered by the control circuit 18 or even a relay. However, the SCR shown has been found to provide the switching and current carrying capabilities.

The control circuit 18 has its own direct current (DC) power supply generally indicated by reference character 20. It is noted that the power supply 20 may either be a rectified power supply as shown in the drawings or may be, equally well, a simple battery which is grounded at 22, which is common with the ground of the SCR switch 14.

The power source 12 is shown herein to be an alternating current (AC) power source which is fully rectified downstream of the load RL by the means of the full wave bridge B1 in order to be compatible with the SCR 14.

As hereinbefore stated, the power supply 20 may obtain its power from the source 12 and will normally be supplied with a step down transformer 23, its secondary winding being fully rectified by the full wave rectifier B2 and wherein the ground output 22 of the power supply 20 will be common with the ground output supply of the rectifier B1. The positive output of the power supply 20 is designated at 24 and the output voltage level thereof is smoothed by way of the capacitor C1. The SCR 14 has its positive pole connected to the positive output 26 of the rectifier B1 and its negative pole directly connected to the ground output of 22 of the rectifiers B1 and B2.

The light activated control circuit 18 generally comprises an integrated circuit (IC) timer T1 which may be purchased off-the-shelf and in this particular design, a Motorola MC 1455 model 555 was selected. IC timing circuits other than the "555" are available. The term "555 timer" is sort of a generic term for a specific IC made by different companies under other part numbers. The power supply output 24 is connected to the timer through the pin 8 and ground output of the power supply by way of pin 1. The variable timing cycle as will be hereinafter described is initiated whenever a voltage is applied to pin 2 which is less than or equal to approximately one-third of the voltage applied in pin 8. When the timer is in the off stage (not running) the output voltage and pin 3 is at ground level or the same level as that of pin 1. When the timer T1 is running, the output voltage at pin 3 is at the same level as the positive input voltage of pin 8 for a purpose that will hereinafter be described.

A capacitor C2 is connected between pin 5 and ground 22. The timing cycle is governed by an RC circuit which comprises a variable resistor RV1 connected between pins 8 and 7 of the timer and a capacitor C3 which is connected between pin 7 and ground 22. The operation of the timer also requires that pin 6 be connected to pin 7 as shown in the diagram. Pin 4 of the timer is a reset pin and is connected to the positive output 24 of the power supply through a resistor R1 which may be a fixed resistor and is included for protection of the circuit when reset is required. Reset is accomplished by applying a ground voltage to pin 4 through a reset switch SW2.

The output pin 3 of the timer T1 is connected to ground 22 through a pair of resistors R2 and R3 which form a voltage divider, the junction of which is connected to the gating input 16 of the SCR 14. It is readily seen that when the timer is not running and the voltage at pin 3 is at ground, there will be no current through the voltage divider R2 and R3. However, when the timer is running and the output pin 3 of the timer T1 is at positive voltage level 24, the voltage difference between pin 3 and ground is divided by the resistors R2 and R3, with the juncture thereof being sufficient to gate the SCR 14 thereby completing the circuit through the rectifier B1 and applying the power source 12 to the load RL whenever the switch SW1 is closed.

Within the trigger controlled circuit 18 is a triggering circuit 28 comprising an ambient photosensor P1 and at least one trigger photosensor P2. This particular circuit depicts two trigger photosensors in parallel, P2 and a second P3 arranged with a potentiometer RP1 and variable resistor RV2 to form a comparator network for providing the desired inputs to pin 2 of the timer T1 as will be hereinafter set forth.

The ambient photosensor P1, as used in this circuit, is a cadmium sulfide cell (CdS) in which the resistance is inversely proportional to the intensity of the ambient light present at the sensor. The sensor P1 is connected between the positive output 24 of the power supply and a junction point 30 which is connected to pin 2 of the timer T1. The parallel trigger photosensors (CdS cells) P2 and P3 are connected between the juncture 30 and ground through the variable resistor RV2. The potentiometer RP1 is connected between the positive output 24 of the power supply and ground 22 through the variable resistor RV2 connected in series therewith, the wiper of RP1 being connected directly to the juncture 30 to form a part of a comparator or voltage divider network. The variable resistor RV2 should be of a type having a low-end resistance greater than the low-end resistance of the ambient photosensor P1 and having a high-end resistance substantially less than the high-end resistance of the ambient photosensor P1.

In describing the triggering circuit 28, the potentiometer RP1 is simply for the purpose of adjusting sensitivity between the ambient photosensor and the trigger photosensors and will be disregarded for the initial description of the circuit. It is readily seen that so long as the total resistance of the variable resistor RV2 and the parallel photosensors P2 and P3 are equal to or greater than one-third of the resistance of the ambient photosensor P1, the voltage at the juncture 30 or at pin 2 of the timer T1 and will be greater than one-third of the input voltage at pin 8 thereby leaving the timer T1 turned off.

However, when the total resistance of the resistor RV2 and photosensors P2 and P3 become less than one-third of the resistance across the ambient photosensors P1, the voltage at juncture 30 or pin 2 of the timer will be less than one-third of the positive input voltage at pin 8 thereby starting the timer to run the cycle preset by the RC network RV1 and C3. The value of the variable resistor RV2 should be set so that when the ambient photosensor and trigger photosensors are exposed to daylight conditions, the juncture 30 is at a voltage sufficiently high to prevent timer T1 from turning on. Further, the positioning of the ambient photosensor P1 should be such that it is not exposed to triggering light sources whether it be automobile headlights or other desired triggering source.

Therefore, in darkness, when a triggering light source is applied to either or both of the trigger photosensors P2 and P3, the total resistance of RV2 and the trigger photosensors is sufficiently small compared to the high resistance of the ambient photosensor such that the voltage level at the junction 30 and pin 2 of the timer is sufficiently low to start the timer running. The timer itself is such that while the timer is running, it is immune to any further triggering inputs via pin 2.

The application of the circuit depicted in FIG. 1 hereinbefore described is particularly suitable for use in turning carport lights, porch lights or the like by positioning the trigger photosensors P2 and P3 at either end of the circular driveway or so that when either of the sensors is struck by auto headlights, the timer is activated which in turn provides a proper gating voltage to the SCR 14 thereby applying voltage to the load RL. It is readily seen that the sensitivity of the device may be adjustable by utilizing the potentiometer RP1. When the device is set up, RP1 should be utilized and adjusted in darkness to the point where the timer is activated and then should be backed off to adjust the sensitivity thereof.

Referring now to FIG. 2, it is readily seen that the circuit thereof is very similar to that of FIG. 1 in relation to the power source 12, the rectifier B1 and SCR 14. The circuit of FIG. 2 likewise includes a power supply 20 which is substantially identical to the power supply 20 of FIG. 1. The circuit of FIG. 2 however includes a trigger control circuit 32 utilizing two separate timers T2 and T3 each of which is an integrated circuit identical to the timer T1 of FIG. 1. A trigger control circuit 32 of FIG. 2 also includes a triggering circuit 28 which is identical to the triggering circuit of FIG. 1. Pin 2 of the timer T2 is connected to the juncture 30 of the triggering circuit 28. Pin 4 is connected to the positive output 24 of the power supply 20 through the resistor R4. Pin 8 is likewise connected to the output 24 of the power supply and pin 1 is connected to the ground output 22 of the power supply. The timing duration of the timer T2 is controlled by the RC circuit made up of R5 connected between pins 7 and 8 and the capacitor C4 which connects pins 6 and 7 to ground level 22. Pin 5 is connected to ground level 22 through capacitor C5. The timer output pin 3 is connected to pin 2 of timer T3 through a capacitor C6 for a purpose that will be hereinafter set forth. Pin 2 of the timer T3 is connected to the positive output 24 through a resistor R6. Pin 4 of the timer T3 is connected to the positive output 24 through resistor R7. Pin 3 of timer T2 is also connected to pin 1 of timer T3 which establishes a second ground 34. Pin 4 of the timer T3 is connected to the ground 34 through a reset switch SW3. Pin 5 is connected to the ground 34 through a capacitor C7. The pin 8 of the timer T3 is connected to the positive output 24 and the timing interval of T3 is controlled by the adjustable RC circuit comprising variable resistor RV3 connected between pins 7 and 8 and capacitor C8 connected between pin 6 and 7 and the ground 34. The output of pin 3 is connected to ground 34 through a pair of resistors R8 and R9 forming a voltage divider the juncture of which is connected to the gating input 16 of the SCR 14.

It will normally be desirable in the configuration of FIG. 2 to fix the RC circuit of timer T2 so that timer T2 will run for very short intervals whereas the adjustable RC circuit of timer T4 will be adjusted for the desired interval in which to apply power to the load RL.

It is readily seen that when both timers are off, there will be no gating voltage to the SCR 14 thereby keeping the load off. When timer T2 is activated by the triggering circuit 28 in the manner hereinbefore described in connection with FIG. 1, output pin 3 of timer T2 will be at a positive state leaving the timer T3 untriggered. After the timer T2 has run its relatively short interval, the voltage level at the output pin 3 will drop to ground 22 which will send a negative pulse across the capacitor C6 to initiate the timer T3. Simultaneously therewith, the ground circuit 34 for the timer T3 will be supplied a negative or ground voltage 22 while the timer T3 is running. Likewise while the timer T3 is running the output pin 3 thereof will assume a positive voltage thereby supplying positive voltage to the gate input 16 of the SCR 14, activating said SCR thereby applying power 12 to the load RL.

Should the timer T2 be triggered again by a subsequent light source, while T3 is on, ground will be removed from the timer T3 thereby stopping the timer while timer T2 recycles for a very short time. When T2 turns off, after said recycling, again a negative pulse will be transmitted across the capacitor C6 starting timer T3 in operation again. It has been found by experimentation that an unexpected result occurs when timer T2 is triggered again, while T3 is on, that being that power to the load RL is not immediately removed and, providing the timing interval of the timer T2 is short enough, there is no interruption in power supplied to the load RL.

Sould it be desired to stop the timer T3 before it has completed its cycle, a switch SW3 is provided which may be momentarily depressed applying ground voltage to pin 4 of the timer T3 thereby shutting the timer off. In applications where the device is triggered by passing automobiles (highway signs), SW3 may be replaced by a phototransistor or CdS cell placed so that the headlights would strike this transistor when a point was reached where turn off is desirable, turning the device off. This particular circuit is adaptable for use with illuminating advertising signs and the like where it is desired that the headlights of each approaching motorist restart the timing cycle of the timer T3.

Referring now to FIG. 3, the light activated switching means depicted therein is similar to that of FIG. 1 wherein a load RL may be supplied with power from the source 12 by means of the SCR switch 14 having gating input 16. The circuit includes a triggering control circuit 36 which is powered by the power supply 20 as hereinbefore described.

The triggering control circuit 36 comprises a triggering circuit 38 which is similar to the triggering circuit 28 but depicts the use of photosensitive transistors as opposed to cadmium sulfide cells for the triggering function as hereinbefore described. The triggering control circuit 36 also comprises a timer T4 which is an integrated circuit identical to the timer T1 hereinbefore described.

The triggering circuit 38 comprises an ambient photosensor P4 having one side thereof connected to the positive output 24 of the power supply 20 and the other side thereof connected to ground 22 through a variable resistor RV4. The emitters of two photosensitive transistors Q1 and Q2 are connected to the juncture between the ambient photosensor P4 and the variable resistor RV4, the collectors of said transistors Q1 and Q2 being connected to pin 2 of the timer T4. The collectors of the transistors Q1 and Q2 are likewise connected to the positive output 24 of the power supplied 20 through a variable resistor RV5. Triggering sensitivity is provided by RV5 — the greater the resistance of RV5, the less triggering light required for triggering.

The reset pin 4 of the timer T4 is connected to the positive source through resistor R10 which may be variable as shown and to ground through a photosensitive device such as the CdS cell P8. Power is supplied to the timer T4 through pins 8 and 1 and the timing interval is controlled by the RC circuit comprising a variable resistor RV6 connected between pin 7 and 8 and capacitor C9 connecting pin 6 and 7 to ground. A second capacitor C10 is connected between ground and pin 5 of the timer T4. The output of pin 3 is connected to ground by way of a voltage divider made up of resistors R11 and R12, the juncture between said transistors being connected to the gating input 16 of the SCR 14.

When sufficient light is applied to either of the triggering transistors, Q1 or Q2 the voltage level at the juncture between RV4 and P4 is transmitted to the input pin 2 of the timer T4. When such triggering occurs, if there is sufficient light present at the ambient photosensor P4, the resistance thereof will be small enough that the voltage drop thereacross will be insufficient and the voltage at the juncture between P4 and RV4 will be too high to start the timer T4 running. On the other hand, if there is very little light present at the ambient photosensor, the resistance thereof will be high in comparison with the resistance of RV4 thereby creating sufficient voltage drop across P4 to trigger and start the timer T4.

When the timer T4 has been started, pin 3 thereof goes positive thereby providing a supply of voltage for gating the SCR 14. If it is desirable to stop the timer before it has completed its cycle, light may be applied to the CdS cell P8, providing a ground input signal to the reset pin 4 of the timer T4 thereby stopping the timing cycle. It is noted at this point that P8 operates as a reset switch and may either be a switch similar to SW2 and SW3 of FIGS. 1 and 2 respectively, a cadmium sulfide cell, or even a phototransistor. Applicant has found that the uses for the circuit described in FIG. 3 are similar to the uses of the circuit described in FIG. 1. However, the use of photosensitive transistors in the place of cadmium sulfide cells in the triggering circuits has been found to produce a faster reaction time for triggering the timer T4.

Referring to FIG. 3a, a triggering circuit 39 is depicted which is an alternative to the circuit 38 of FIG. 3. In this case, the phototransistors are parallel connected in series with the ambient sensor P4 and the variable resistor RV4. Pin 2 of the timer T4 is connected at the juncture between the photoelements Q1 and Q2. In this case, there is no absolute requirement for the variable resistor RV5 shown in FIG. 3, although it is helpful in adjusting triggering sensitivity.

When either or both of the phototransistors are triggered to conduct, the voltage drop across the ambient sensor P4 is provided at pin 2 of the timer T4. If the resistance through P4 is sufficiently great, compared to the resistance through the phototransistors Q1 and Q2 and the variable resistor RV4, the timer will start its cycle.

Referring now to FIG. 4, the circuit describes a light activated load switch utilizing the SCR 14 for applying the power source 12 to the load RL. FIG. 4 depicts a triggering control circuit 40 which obtains its power from a power supply 20 as hereinbefore described.

The triggering control circuit 40 comprises a timer T5 which is an integrated circuit substantially identical to the timer T1 along with a triggering circuit represented by reference character 42. The triggering circuit 42 comprises a photosensitive transistor Q4 having its emitter connected to ground 22 and its collector connected to pin 2 of the timer T5. The collector of the transistor Q4 is also connected to the positive output 24 of the power supply 20 through a variable resistor RV7.

The timer T5 obtains its power via pins 8 and 1 and its timing interval is adjustable by the RC circuit comprising a variable resistor RV8 connected between pins 7 and 8 thereof and the capacitor C11 connecting pins 6 and 7 to ground. Pin 5 of the timer T5 is connected to ground through the capacitor C12. The output pin 3 of the timer T5 is connected to ground through the voltage divider made up of resistors R13 and R14, the juncture therebetween being connected to the gating input 16 of the SCR 14.

The reset pin 4 of the timer T5 is connected to the positive output 24 of the power supply 20 through the variable resistor RV9 and to ground through a CdS cell P7. A polarizing filter 44 is shown in phantom lines adjacent the photoreceiver of the CdS cell P7 for a purpose that will be hereinafter set forth. In operation when a triggering light source is applied to the photobase of the transistor Q4, the input pin 2 of the timer T5 goes to ground thereby activating the timer T5 for its timing cycle which in turn applies gating voltage to the SCR 14. If it is desirable to turn off the timer T5 before it has completed its cycle a light source may be applied to the CdS cell P7 thereby causing a large voltage drop at pin 4 of the timer T5 which turns off said timer. The circuit of FIG. 4 is particularly adaptable for the use in store buildings or the like where it is desirable for a security guard to be able to shine his flashlight at the triggering transistor Q4 in order to turn on the load or lights RL in the store building for inspection thereof.

Normally in this use, the cycle for the timer T5 will be set for something like 30 minutes in order to give the security guard or officer ample time to thoroughly inspect the premises while the store building is lighted. However, if his inspection is only routine, he may wish to turn off the lights by directing his flashlight to the CdS cell P7 thereby resetting the timer and turning it off. This arrangement will work very well providing the photo device Q4 and P7 are spaced sufficiently apart so that the triggering or reset light does not strike both devices at the same time.

On the other hand, if it is desirable to locate the photo devices Q4 and P7 adjacent each other, it will be necessary to cover the CdS cell P7 with a polarizing filter and for the inspecting officer or security guard to utilize a polarizing filter in conjunction with his flashlight as will hereinafter be described. Regardless of the arrangement, it will be desirable to adjust the sensitivity of the reset photo device P7 and RV9 so that it would be more sensitive to light than the transistor Q4 thereby protecting the circuit from turning on under ambient light conditions present at both transistors. Otherwise, as light levels fall in the evening, the load would turn on and stay on for the full duty cycle. As the triggering sensitivity is adjusted by varying the value of RV7, the reset sensitivity of RV9 must also be adjusted or the triggering sensitivity might exceed the reset sensitivity. This is easily accomplished by using two variable resistors on a common shaft. The relative values of RV7 and RV9 can be determined by experimentation.

Referring now to FIG. 5, reference character 44 depicts a flashlight which is representative of a triggering light source or can be representative of an ambient light source. For purposes of further describing the circuit of FIG. 4, reference character Q4 represents the triggering transistor Q4 while the ambient sensor represents CdS cell P7. The optional polarizing filter 45 is shown adjacent to CdS cell P7. A second light source is depicted by reference character 46 and is provided with a polarizing filter 48. It can be seen by orienting the polarizing lines of the polarizing filter 48 at right angles to the polarizing lines of the polarizing filter 45, when the light source 46 is activated it will provide a triggering light source to the transistor Q4 while the filter 45 will block the triggering light source from the ambient light sensor P7 as hereinbefore described. The particular arrangement is necessary only when it is desirable to locate or position the photosensors Q4 and P7 adjacent to each other. If the light source 44, or any other non-polarized light source either as ambient or as a triggering light source is directed onto Q4 and P7, the light will strike the light-sensitive elements of both. When the "555" timer receives both triggering and reset impulses at the same time, the timer remains in the off position, or if already on turns off. If used to illuminate the interior of a building for patrol inspection the load could be turned off when visual inspection was completed by rotating the filter 90° thus illuminating the reset or ambient light sensor turning the timer off. Of course, the value of the polarizing filters is to limit triggering of the device to persons specially equipped with light sources with polarizing filters. If this limitation of operation is not desired the two light sensors would be moved several feet apart and the polarizing filters omitted.

Referring now to FIG. 6, the circuit depicts the light activated switch SCR 14 for supplying electrical power from the source 12 to activate the load RL. The circuit includes a triggering control circuit 50 which derives its power from the power supply 20 hereinbefore described. The triggering control circuit 50 comprises an integrated circuit timer T6 which is substantially identical to the timer T1 hereinbefore described. The control circuit 50 also comprises three or more remote triggering devices 52, 54, and 56 which are connected to each other by means of cables 58 and 60, the entire group being connected to the timer T6 and its associated circuitry by means of a cable 62. The remote triggering devices 52, 54 and 56 comprise photosensitive transistors Q6, Q7 and Q8, respectively.

The circuit includes an ambient photosensor P5 having one side thereof connected to the positive output 24 of the power supply 20, the other side being connected to ground through the variable resistor RV8 and fixed resistor R15 connected in series. The emitters of transistors Q6, Q7 and Q8 are connected to the juncture between the photosensor P5 and the variable resistor RV8, the collectors thereof being connected to input pin 2 of the timer T6. The said collectors are also connected to the positive output 24 of the power supply 20 through a variable resistor RV9.

The timer T6 derives its power through pins 8 and 1 and the duration of the timing cycle is controlled by the adjustable RC circuits comprising the variable resistor RV10 connected between pins 7 and 8 and the capacitor C13 connecting pins 6 and 7 to the ground. Pin 5 of the timer T6 is connected to ground through capacitor C14. Reset pin 4 of the timer T6 is connected to the positive output 24 of the power supply 20 via the resistor R16 and is connected to ground through a photosensitive device P6 which may be a cadmium sulfide cell or the like. Reset capability would be omitted in certain applications. In that case, the only connection to pin 4 is the resistor to the positive voltage source. The operation of the circuit in FIG. 6 is identical to the operation of the circuit described in relation to FIG. 3. It is readily seen that the components associated with the timer T6 may be located inside a building or protected from the elements and from tampering while the only exposed components are the remote triggering devices 52, 54 and 56.

Whereas, the present invention has been described in particular relation to the drawings attached hereto it is obvious that other and further modifications apart from those shown or suggested herein may be made within the spirit and scope of the invention. For example, the photosensitive devices which have been shown herein have been represented, in some cases as cadmium sulfide cells, while in other cases photosensitive transistors. These and other available devices may be used such as photodarlington networks and the drawings are not intended to limit the apparatus to those photosensitive elements described herein.

It is also understood that the triggering circuits such as 28 and 38 or the one used in FIG. 4 are interchangeable with one another as are the "one-shot" timers used in FIG. 1 and the recycling timer used in FIG. 2.

It should be noted that the variable resistors RV2, (FIGS. 1 and 2), RV4 (FIG. 4) and RV8 (FIG. 6) are used, not just to prevent turn-on during daylight conditions, but to adjust the amount of ambient light required to suppress turn-on. The greater the resistance of RV2, RV4 or RV8, less ambient light is required to suppress turn-on.

What is claimed is:

1. A light activated electrical load switch for providing power from a power source to a load and comprising:
a. gatable switching means connected in series with the power source and the load;
b. phototriggered switch control means operably connected to the gatable switching means for selective gating thereof, said control means comprising;
  1. power supply;
  2. timer means operably connected to the power supply and having an output operably connected to the gatable switching means for gating thereof when the timer means is running;
  3. photosensitive triggering sensor means operably connected to the power supply;

4. photosensitive ambient sensor means operably connected to the power supply;
5. comparator means operably connected to the triggering sensor means and the ambient sensor means, the output thereof being connected to an input of the timer means for starting the timer means running when the triggering light source intensity is sufficiently greater than the ambient light source intensity.

2. A light activated load switch as set forth in claim 1 wherein the gatable switching means comprises a silicon control rectifier.

3. A light activated load switch as set forth in claim 1 wherein the power supply comprises a transformer, a full wave rectifier and filter attached to the secondary of the transformer.

4. A light activated load switch as set forth in claim 1 wherein the triggering sensor means comprises a photosensor resistance means operably connected between the input of the timer means and the power supply, wherein the said photosensor resistance means is inversely proportional to the triggering light intensity applied thereto.

5. A light activated load switch as set forth in claim 4 wherein the ambient sensor means comprises a second photosensor resistance means operably connected between the input of the timer means and the power supply, wherein the resistance is inversely proportional to the ambient light intensity applied thereto.

6. A light activated load switch as set forth in claim 5 wherein the comparator means comprises a variable centerpole potentiometer operably connected to the power supply as a voltage divider said variable centerpole being connected to the input of the timer means whereby one side of said potentiometer and one side of the ambient sensor means are connected to one output terminal of the power supply and other side of the potentiometer and one side of the triggering means is connected to the other output terminal of the power supply.

7. A light activated load switch as set forth in claim 6 wherein a load protection resistor is interposed between the power supply and the comparator means.

8. A light activated load switch as set forth in claim 1 wherein the timer means includes reset switching means.

9. A light activated load switch as set forth in claim 8 wherein the reset switching means is a photosensitive device.

10. A light activated load switch as set forth in claim 1 wherein the timer means comprises a first timer unit having adjustable run interval and having output operably connected to the gatable switching means, and a second timer unit having a relatively short run interval and having its output operably connected to the input of the first timer unit, the input of the first timer unit being operably connected to the comparator means, means operably connected between said timer units such that when the second timer is running, the first timer is off and when the second timer stops running, the first timer is started running.

11. A light activated load switch as set forth in claim 1 wherein the photosensitivity triggering means is packaged separately from the remainder of the switch control means with cable connections for remote positioning of said triggering means.

12. A light activated electrical load switch for providing power from a power source to a load and comprising:
a. gatable switching means connected in series with the power source and the load;
b. phototriggered switch control means operably connected to the gatable switching means for selective gating thereof, said control means comprising;
1. power supply;
2. timer means operably connected to the power supply and having output operably connected to the gatable switching means for gating thereof when the timer means is running;
3. photosensitive triggering sensor means operably connected to the power supply;
4. photosensitive ambient sensor means operably connected to the power supply; and
wherein the triggering sensor means comprises at least one photosensitive transistor and is operably connected between the input of the timer means and the power supply, wherein said phototransistor becomes conductive when the triggering light is applied thereto.

13. A light activated load switch as set forth in claim 12 wherein the ambient sensor means comprises a photosensor resistance means operably connected between the input of the timer means and the power supply, wherein the resistance is inversely proportional to the ambient light intensity applied thereto.

14. A light activated load switch as set forth in claim 12 and including a variable resistor connected between one side of the ambient sensor means and one output terminal of the power supply to form a voltage divider, one side of the triggering sensor means being connected to the junction between said variable resistor and said ambient sensor means.

15. A light activated load switch as set forth in claim 12 and including sensitivity adjustment means operably connected between the power source and the phototransistor means to adjust sensitivity of the phototransistor means.

16. A light activated load switch as set forth in claim 12 wherein the timer means includes reset switching means.

17. A light activated load switch as set forth in claim 16 wherein the reset switching means is a photosensitive device.

18. A light activated load switch as set forth in claim 12 wherein the timer means includes reset input means.

19. A light activated load switch as set forth in claim 18 wherein the ambient sensor means comprises a photosensor resistor means operably connected between the reset input means of the timer means and the power supply.

20. A light activated load switch as set forth in claim 19 and including first sensitivity adjustment means operably connected to the triggering phototransistor and second sensitivity adjustment means operably connected to the ambient sensor means whereby relative adjustments of sensitivity may be made to make the ambient sensor means more sensitive.

21. A light activated load switch as set forth in claim 20 including means to selectively gang said first and second sensitive adjustment means to simultaneously change sensitivity of both triggering and ambient sensor means.

22. A light activated load switch as set forth in claim 21 including polarizing filter means operably connected to the ambient sensor means and polarized light source for use with said load switch.

* * * * *